(12) United States Patent
Wimpenny

(10) Patent No.: US 9,391,510 B2
(45) Date of Patent: Jul. 12, 2016

(54) SWITCH MODE POWER SUPPLY FOR ENVELOPE TRACKING

(75) Inventor: Gerard Wimpenny, Cambourne (GB)

(73) Assignee: SNAPTRACK, INC., San Diego, CA (US)

( * ) Notice: Subject to any disclaimer, the term of this patent is extended or adjusted under 35 U.S.C. 154(b) by 83 days.

(21) Appl. No.: 13/816,842

(22) PCT Filed: Aug. 15, 2011

(86) PCT No.: PCT/EP2011/064046
§ 371 (c)(1),
(2), (4) Date: Apr. 23, 2013

(87) PCT Pub. No.: WO2012/020144
PCT Pub. Date: Feb. 16, 2012

(65) Prior Publication Data
US 2013/0200865 A1    Aug. 8, 2013

(30) Foreign Application Priority Data

Aug. 13, 2010 (GB) .................................. 1013664.6

(51) Int. Cl.
*H02M 3/156* (2006.01)
*H02M 3/157* (2006.01)
(Continued)

(52) U.S. Cl.
CPC ................ *H02M 3/156* (2013.01); *G05F 1/56* (2013.01); *H02M 1/08* (2013.01); *H02M 3/157* (2013.01); *H02M 3/158* (2013.01); *H02M 3/1588* (2013.01); *H03F 1/0244* (2013.01); *H03F 3/2173* (2013.01); *H03F 2200/102* (2013.01);
(Continued)

(58) Field of Classification Search
CPC ...... H02M 3/156; H02M 3/157; H02M 3/158

USPC ............ 323/225, 247, 259, 282–290; 363/65; 327/108–112
See application file for complete search history.

(56) References Cited

U.S. PATENT DOCUMENTS 4,764,857 A * 8/1988 Konopka ......................... 363/49
5,825,638 A * 10/1998 Shutts ......................... 363/21.11
(Continued)

FOREIGN PATENT DOCUMENTS

EP     1855381 A1  11/2007
WO   2008105073 A1   9/2008

OTHER PUBLICATIONS

English"Reliable Operation of MOSFETs in Bridge Circuits" Translation "zuverlässiger betrib von Mosfets in Bruckenschaltungen", May 12, 1989.*
(Continued)

*Primary Examiner* — Timothy J Dole
*Assistant Examiner* — Ishrat Jamali

(57) ABSTRACT

There is disclosed an envelope tracked power supply comprising a high bandwidth, low delay closed loop switch mode power supply stage comprising: a pulse width modulator for generating a width modulated pulse in dependence on an input signal and an output voltage of the switch mode power supply stage; a wideband transformer, having a winding of a first side connected to receive the modulated pulse, and a winding of a second side; and an output stage connected to the winding of the second side of the transformer, and for generating the output voltage in dependence on the modulated pulse induced in the winding of the second side.

11 Claims, 7 Drawing Sheets

(51) Int. Cl.
  *H02M 3/158* (2006.01)
  *H02M 1/08* (2006.01)
  *H03F 1/02* (2006.01)
  *H03F 3/217* (2006.01)
  *G05F 1/56* (2006.01)

(52) U.S. Cl.
  CPC ..... *H03F 2200/351* (2013.01); *H03F 2200/451* (2013.01); *Y02B 70/1466* (2013.01)

(56) References Cited

U.S. PATENT DOCUMENTS

| | | | |
|---|---|---|---|
| 6,674,271 B2 * | 1/2004 | Choo | H02M 3/33561 323/282 |
| 6,807,071 B1 | 10/2004 | Zhang et al. | |
| 2002/0141206 A1 | 10/2002 | Brkovic | |
| 2005/0068793 A1 * | 3/2005 | Davies et al. | 363/41 |
| 2007/0109817 A1 | 5/2007 | Shimura et al. | |

OTHER PUBLICATIONS

Philippe Riehl / Yolaine Cussac, "Related International Patent Application No. PCT/EP2011/064046 International Preliminary Report on Patentability", Feb. 28, 2013, Publisher: PCT, Published in: EP.

Hassig, H.R., et al., "Zuverlassiger Betrieb Von Mosfets in Bruckenschaltungen", "Elektronik, IRL Press Limited", May 12, 1989, pp. 55, 56, 58-63/ Fig(s): 1A; 2C, vol. 38, No. 10, Publisher: ISSN: 0013-5658, Published in: DE.

"Related GB Patent Application No. GB1013644.6 Search Report", Dec. 16, 2010, Publisher: GB IPO, Published in: GB.

Philippe Riehl, "Related International Patent Application No. PCT/EP20111064046 International Search Report and Written Opinion", Oct. 15, 2012, Publisher: PCT, Published in: EP.

* cited by examiner

SWITCH MODE POWER SUPPLY FOR ENVELOPE TRACKING

BACKGROUND TO THE INVENTION

1. Field of the Invention

The present invention relates to an output stage of a switch mode power supply, in which a pulse width modulator generates a modulated pulse for delivery to an output switching stage via a driver stage. One or more feedback paths provide signals representative of the output of the output stage to an input of the pulse width modulator.

2. Description of the Related Art

With reference to FIG. 1 there is illustrated a typical prior art structure of a switch mode power supply including a pulse width modulator (PWM) generator.

As illustrated in FIG. 1, there is provided a PWM generator 10, a driver stage 12, and an output stage 14 in the switch mode power supply.

The PWM generator 10 generates pulse width modulated signals on a first output 26 and optionally on a second output 28, the signals on the second output being the inverse of the signals on the first output. The PWM generator 10 generates the pulse width modulated signals at its output(s) in dependence on a reference input signal REF on line 9.

The driver stage 12 receives the pulse width modulated signals on lines 26 (and optionally on line 28), and generates corresponding drive signals on line 30 and line 32. The drive signals on line 30 and on line 32 are provided as inputs to the output stage 14.

In the illustrated example of FIG. 1, the output stage includes a half-bridge arrangement comprising a pair of push-pull transistors, illustrated as FETs 16 and 18. The high-side FET 16 has its channel connected between a supply voltage $V_{DD}$ and an output node, and the low-side FET 18 has its channel connected between the output node and electrical ground. The control nodes of the FETs 16 and 18 are respectively connected to receive the drive signals on lines 30 and 32.

The output stage 14 may be one stage of n output stages, each output stage providing one of n phases of an n-phase converter.

The output node provides an output signal on line 34, which is delivered to a filter 20 before the output signal OUT is generated on line 36. The filter 20 comprises an inductor connected between the lines 34 and 36, and a capacitor 24 connected between the line 36 and electrical ground.

The closed loop operation of the switch mode power supply of FIG. 1 is provided by a feedback loop from the output of the output stage 14 to the input of the PWM generator 10. This feedback may be an output current feedback or an output voltage feedback, or both. In FIG. 1 a connection line 33 represents an output voltage feedback, providing the output voltage on line 36 to an input of the PWM generator 10. Also shown in FIG. 1 is a connection line 35 representing an output current feedback, providing the output current on line to an input of the PWM generator 10. The provision of voltage and current feedback loops, and their implementation to provide a feedback, is well-known in the art. As is also well-known in the art, the PWM generator 10 is adapted to generate the PWM output signals in dependence on the reference signal on line 9 modified by the feedback signals on lines 33 or 35.

As can be understood with reference to FIG. 1, to drive the transistors of the output stage 14 the driver stage 12 is required to be capable of generating signals for both the high-side (FET 16) and the low-side (FET 18) output switching transistors. In certain applications it is advantageous for the transistors of the output stage 14 to have a high switching speed. However the limitations of commercially available integrated circuit drivers for the driver stage 12 are such that they can introduce a significant delay (typically, with current technologies, of the order of 70 to 150 ns). This problem is particularly acute for high voltage drivers, e.g. of the order of 50V and greater. Moreover the delay affects the performance of the closed loop operation as it limits the maximum stable closed loop bandwidth. The delays also mean that the fast switching speeds of an output switching stage constructed with fast transistors, such as GaN transistors, cannot be fully exploited.

It is an aim of the present invention to provide an improved output stage for use in a high bandwidth closed loop application, which enables the potential switching speed of the output stage to be realised, and/or which improves the closed loop bandwidth.

SUMMARY OF THE INVENTION

The invention provides an envelope tracked power supply comprising a high bandwidth, low delay closed loop switch mode power supply stage comprising: a pulse width modulator for generating a width modulated pulse in dependence on an input signal and an output voltage of the switch mode power supply stage; a wideband transformer, having a winding of a first side connected to receive the modulated pulse, and a winding of a second side; and an output stage connected to the winding of the second side of the transformer, and for generating the output voltage in dependence on the modulated pulse induced in the winding of the second side.

The output switching stage may comprise a transistor having a conductive path connected between a supply voltage and an output of the switch mode power supply, and a control mode connected to receive the modulated pulse induced in the winding of the second side.

The envelope tracked power supply may further comprise a diode connected in parallel with the winding of the second side of the transformer.

The envelope tracked power supply may further comprise a resistor connected between the control node and the output.

The output stage may comprise a diode connected between the output and a further supply voltage.

The envelope output stage may comprise a further transistor having a conductive path connected between a further supply voltage and the output. The pulse width modulator may generate a further width modulated pulse which is connected to a control mode of the further transistor. The pulse width modulator may generate a further modulated pulse, and the switch mode power supply comprising a further transformer, having a winding of a first side connected to receive the further modulated pulse, and a control node of the further transistor is connected to receive the further modulated pulse induced in the winding of a second side of the further transformer. The transformer may have a further winding of the second side, and a control node of the further transistor is connected to receive the modulated pulse induced in the further winding of the second side of the transformer.

The envelope tracked power supply may further comprise a diode connected in parallel with the winding of the second side of the transformer.

The envelope tracked power supply may further comprise a resistor connected between the control node of the further transistor and the further supply voltage.

The envelope tracked power supply may further comprise a circuit at the control node of the transistor and a circuit at the control node of the further transistor, each arranged to apply an asymmetrical delay to a rising or falling edge of a signal at the control node. Each circuit may include: an asymmetric delay for rising and falling edges of a signal, and arranged to receive the modulated pulse signal from the respective winding of the transformer; and a driver stage arranged to receive the output of the respective delay stage and provide as an output the signal for the control node of the respective transistor of the output switching stage.

The closed loop bandwidth of the switch mode power supply is preferably greater than 50 KHz.

The delay of the transformer is preferably less than 100 ns.

The input signal preferably represents the envelope of a signal to be amplified.

The envelope tracked power supply may further comprise an error correction stage for correcting an error in the output voltage in dependence on a comparison between the output voltage and the input signal.

An RF power amplification stage may comprise an envelope tracked power supply as defined.

The invention further provides the defined switch mode power supply without limitation to an envelope tracked power supply. Thus the invention may provide a high bandwidth, low delay closed loop switch mode power supply stage comprising: a pulse width modulator for generating a width modulated pulse in dependence on an input signal and an output voltage of the switch mode power supply stage; a wideband transformer, having a winding of a first side connected to receive the modulated pulse, and a winding of a second side; and an output stage connected to the winding of the second side of the transformer, and for generating the output voltage in dependence on the modulated pulse induced in the winding of the second side.

BRIEF DESCRIPTION OF THE DRAWINGS

The present invention is described by way of example with reference to the accompanying drawings in which.

DESCRIPTION OF THE PREFERRED EMBODIMENTS

Figure 1:
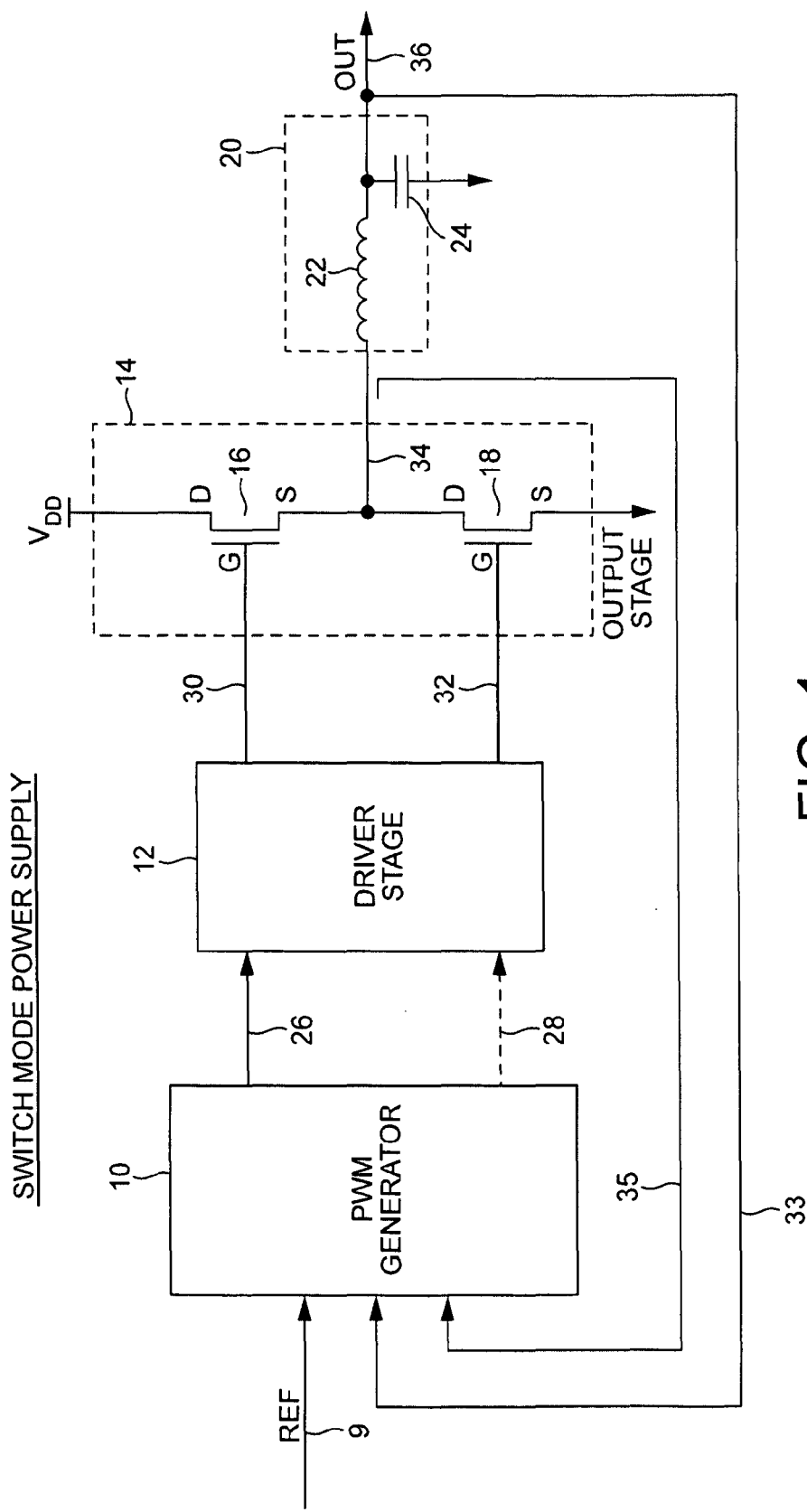
FIG. 1 illustrates a switch mode power supply in accordance with the prior art.

The invention is described herein with reference to non-limiting examples. One skilled in the art will appreciate that the invention is not limited to the details of the examples given herein, and the examples may be modified within the scope of the invention, and further examples not described herein are encompassed by the invention.

The invention, and its embodiments, apply to a closed loop switch mode power supply. In such an arrangement, as discussed in the background section above, one or more feedback loops provide connections from the output to the input.

As discussed in the background section, these feedback loops may provide a signal or signals representative of the current and/or the voltage at the output. The provision of such feedback arrangements in a closed loop arrangement is known to one skilled in the art. The current feedback may be provided, for example, by sensing the current flowing in the output of the output switching stage, or in a transistor of the output switching stage. The voltage feedback may be provided simply by feeding-back the output voltage from either the input or the output of an output filter.

For the purposes of describing embodiments of the invention, in the following description a closed loop switch mode power supply is illustrated in which the feedback is the output voltage. However the invention is not limited to this particular closed loop feedback arrangement, which is purely for purposes of description.

As known in the art, in a closed loop the feedback signal is combined with an input signal to the loop, to generate a signal representing the error between the input and output signals.

In the following discussion with reference to the Figures, like reference numerals illustrate elements in different figures which correspond to each other.

A first embodiment of the invention is illustrated with reference to FIG. 2. In this exemplary embodiment, the output stage 14 includes the high-side FET 16 and the low-side FET 18. In general the high-side FET may be N-type or P-type. The PWM generator 10 is arranged to provide separate drive signals for the high-side and the low-side.

As illustrated, the high-side FET driver of the PWM generator may be modelled or represented as a voltage source 40 in series with a resistor 38. The resistor 38 is connected to an output line 42 of the PWM generator 10, and the voltage source 40 is connected to electrical ground. The voltage source 40 and resistor 38 provide a PWM output signal for the high-side FET 16.

Figure 2:
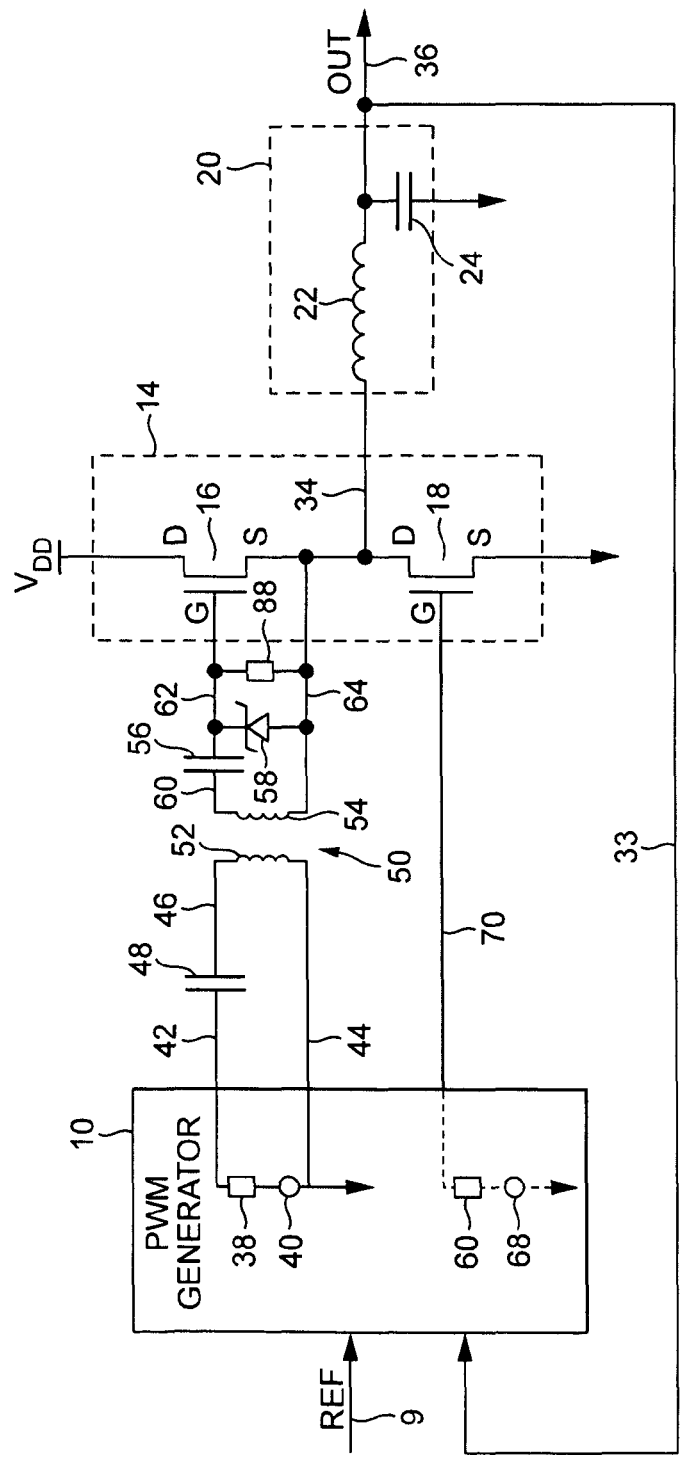
FIG. 2 illustrates a switch mode power supply in accordance with a first embodiment of the invention.

As also illustrated in FIG. 2, the low-side FET driver of the PWM generator 10 may be modelled or represented as a voltage source 68 in series with a resistor 66. The resistor is connected to an output line 70 of the PWM generator 10, and the voltage source 68 is connected to electrical ground. The voltage source 68 is connected to electrical ground as the channel of the FET 18 is connected between the output node and electrical ground. In the event that the channel of the FET is connected between the output node and a low supply voltage, the voltage source 68 will similarly be connected to the low supply voltage.

The PWM generator 10 is illustrated with a model or representative circuit, as the implementation of such does not form part of the invention. In practice the PWM generator 10 may comprise a half-bridge pair of FETs, being a smaller version of the FETs of the output switching stage 14. The input to such FETs may be provided by the reference signal REF on line 9 adjusted by the feedback signal on line 33. A half-bridge pair of FETs may be provided for generating each of the signal for the high and low-sides of the output switching stage 14.

In the embodiment of FIG. 2, an improved driver stage in accordance with the invention is implemented for the high-side FET only. The high-side FET, in the arrangement illustrated, typically has a large gate voltage swing, whereas the low-side FET operates with a much lower gate voltage swing. Thus the benefits of the present invention can be obtained by providing the principles of the invention for the high-side FET only, although as will be discussed further hereinbelow additional benefits can be obtained by providing the principles of the invention to the low-side FET as well.

Thus in the embodiment of FIG. 2, the PWM output signal on line 70 is connected directly to the control node, i.e. the gate, of the FET 18. As is known in the art, the relative timing of the high-side and low-side drivers of the PWM generator 10 is controlled to obtain correct switching of the output stage 14 so as to avoid shoot-through.

The PWM output signal generated by the series connection voltage source 40 and resistor 38 is connected across the terminals of a winding 52 of a first side of a transformer 50. Thus the output line 42 is connected to one terminal of the transformer winding 52, and the other terminal of the transformer winding 52 is connected to electrical ground on the output line 44. As illustrated in FIG. 2, the signal on line 42 is preferably connected to the first terminal of the winding 52 via a DC blocking capacitor 48, the capacitor 48 being connected between the line 42 and a line 46 which is connected to the first terminal of the winding 52.

A winding 54 of a second side of the transformer 50 is connected across the FET 16, between the control node, i.e. the gate, thereof and the output node of the output switching stage 14. The output node of the output switching stage 14 is connected to the source of the FET 16. As illustrated in FIG. 2, a first terminal of the winding 54 is connected to the gate of the transistor 16 via a DC blocking capacitor 56. The first terminal of the winding 54 is connected to a line 60, and the gate of the transistor 16 is connected to a line 62. A capacitor 56 is connected between the lines 60 and 62. A second terminal of the winding 54 is connected directly to the source of the transistor 16 (and therefore directly to the output node of the output switching stage 14).

The provision of the transformer 50 provides DC isolation between the input side of the driver and the output side of the driver, and therefore DC isolation between the input side and the high-side FET 16 which has a large voltage swing. An inherent characteristic of a wide band transformer is that it has a very low delay. Thus the use of a wide band transformer 50 ensures that the output signal of the PWM generator 10 is delivered to the output transistor of the output stage by a driver with a very low delay.

Thus the provision of the transformer 50 provides a level shifted control stage which has a low delay, particularly avoiding the large delay associated with prior art semiconductor drivers (such as driver stage 12 of FIG. 1).

The transformer 50 is preferably designed to have as low a leakage induction as possible. This contributes to increasing the bandwidth and decreasing the delay.

By improving the switching speed of the output stage of the closed loop arrangement, utilising the transformer as a driver stage, significant benefits are achieved. The fast switching speeds of the transistors in the output stage, made possible by emerging technologies such as GaN-on-Si, can be utilised. In addition the values of the inductors and capacitors in the output filter, 22 and 24, can be reduced in value, which means they can be implemented as smaller size devices: this provides higher power density and reduces costs.

In particular the closed loop transient response speed is also increased, which improves the load regulation of the closed loop. This also enables use of higher bandwidths in modulation applications, such as envelope tracking for RF power amplifier devices.

In addition, the use of the transformer 50 as a driver stage can be used to provide a voltage step-up. The turns ratio on the transformer 50 can be adjusted to provide a desired step-up. This allows the PWM generator to operate from a single low voltage supply, facilitating the design of a high speed PWM generator. As mentioned above advantageously the FETs of the output stage may be implemented as GaN-on-Si FETs, to take advantage of the higher switching speeds associated with such FETs. However the FETs of the output switching stage 14, and in particular the FET 16, may be implemented as Si FETs.

In a preferred arrangement, as illustrated in the embodiment of FIG. 2, a diode is connected between the lines 64 and 62, i.e. between the gate and source of the FET 16. The anode of the diode 58 is connected to the line 64 (and to the source of the FET 16), and the cathode of the diode 58 is connected to the line 62 (and the gate of the FET 16). The diode 58 DC restores the square wave (i.e. restores the dc signal of the square wave) of the pulse width modulated signal provided by the PWM generator 10, and the output of the transformer 50 for delivery to the FET 16.

The arrangement shown in FIG. 2, and discussed hereinabove, illustrates enhancement mode FETs. However depletion mode FETs may alternatively be used. This would require reversing the polarity of the diode 58.

In a further preferred arrangement, as illustrated in the embodiment of FIG. 2, a resistor 88 is connected between the line 62 and the line 64 (i.e. between the gate and source of the FET 60). The resistor 88 helps prevent 'ringing' on the gate waveform due to parasitic inductance and capacitance.

The diode 58 and resistor 88 may be provided individually or together.

The low delay provided by the transformer 50 as part of a driver stage in accordance with the invention is a key feature to provide a high loop bandwidth in a closed loop switcher. The wideband transformer 50 greatly facilitates the design of a high bandwidth closed loop switcher.

Figure 3:
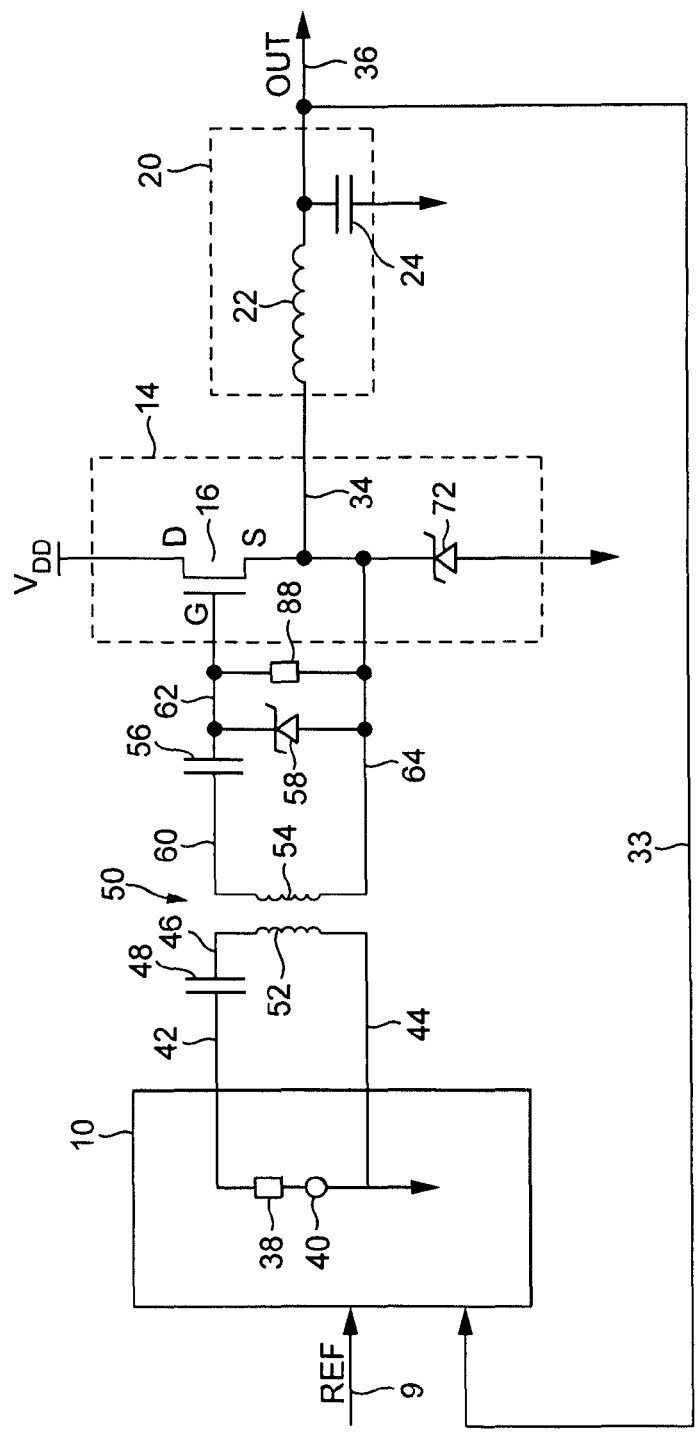
FIG. 3 illustrates a switch mode power supply in accordance with a second embodiment of the invention.

With reference to FIG. 3, a second embodiment in accordance with the invention is illustrated.

In the second embodiment of FIG. 3, the PWM generator 10 provides the PWM output signal for the first winding 52 of the transformer 50 on lines 42 and 44. The FET 18 is replaced by a diode 72, having an anode connected to electrical ground and a cathode connected to the output terminal and therefore output line 34.

The arrangement of FIG. 3 provides an alternative implementation in the output stage 14, which is implementable if the current at the output of the output stage always flows from the output stage to the load.

Figure 4:
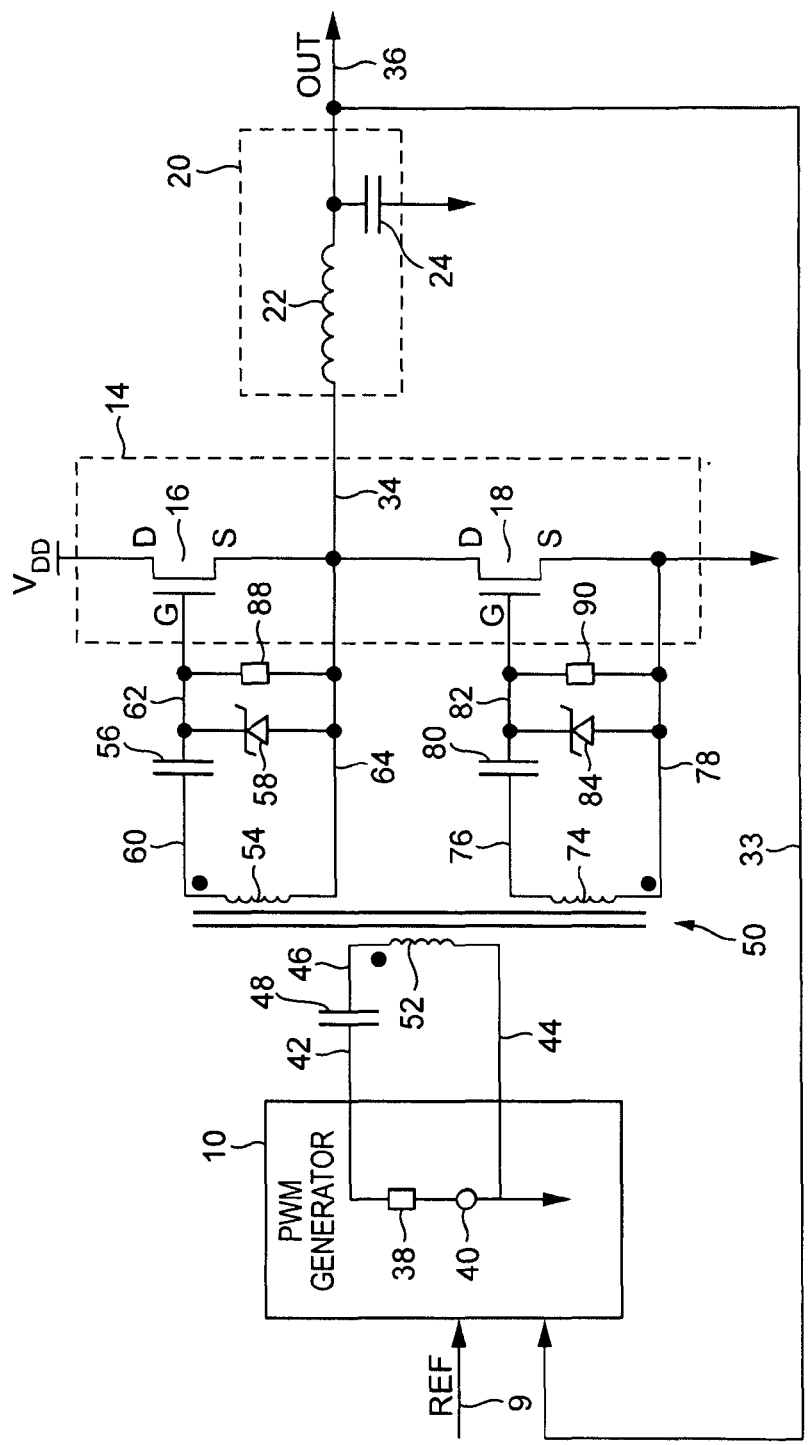
FIG. 4 illustrates a switch mode power supply in accordance with a third embodiment of the invention.

With reference to FIG. 4, a third embodiment in accordance with the invention is described.

In the arrangement of FIG. 4, the PWM generator 10 provides a single output signal on lines 42 and 44 as described with reference to FIG. 2, for delivery to the winding 52 of the first side of the transformer 50. As in FIG. 2, the portion of the output signal on line 42 is delivered to the first terminal of the winding 52 via the capacitor 48, which connects on line 46 to the terminal of the winding 52. Line 44 represents a connection to electrical ground for the voltage source 40 and the second terminal of the winding 52 as discussed with reference to FIG. 2.

In the embodiment of FIG. 4, the transformer 50 is adapted to have two windings on the second side thereof. Thus the second side of the transformer 50 includes the winding 54 as illustrated in FIG. 2, and a further winding 74. The arrangement of the winding 54 and its connection to the FET 16 is the same in FIG. 4 as described in FIG. 2.

The winding 74 is arranged to provide a drive signal for the FET 18. The connection of the winding 74 to the FET 18 is the same as the connection of the winding 54 to the FET 16 as described with reference to FIG. 2. More specifically, the further winding 74 has a first terminal connected to a line 76. A DC blocking capacitor 80 connects to the line 76, and to a line 82. The line 82 connects to the gate of the FET 18. A second terminal of the winding 74 is connected to electrical ground, and the source of the FET 18 is connected to electrical ground. Line 78 represents a connection to electrical ground.

Preferably, a diode 84 is connected between the lines 78 and 82, with an anode connected to the line 78 and a cathode connected to line 82, to DC restore the square wave in the signal. This is an equivalent provision to the diode 53.

Preferably, a resistor 90 is connected between the line 82 and the line 78, i.e. between the gate and source of the FET 18. The resistor 90 is an equivalent provision to the resistor 88 and has the same effect.

In the arrangement of FIG. 4, the transformer splits the phase of the signal from the PWM generator 10 such that opposite phase signals—0° and 180°—are provided to the gates of the FETs 16 and 18.

In the arrangement of FIG. 4 a potential problem arises which does not arise in the arrangements of FIGS. 2 and 3. In the arrangement of FIG. 2, the PWM generator 10 generates an independent drive signal for each half of the half-bridge output switching stage. In view of the independent generation of the drive signals, the PWM generator 10 can control the generation of the signals such that the transistors 16 and 18 are not "on" at the same time. If the transistors 16 and 18 are "on" at the same time, then a condition known as "shoot-through" occurs. Thus the PWM generator is adapted such that the drive signals provided to the transistors 16 and 18 do not provide a condition in which the transistors 16 and 18 are simultaneously on, for example by ensuring that one drive signal is always off whenever the other drive signal is on. However in the arrangement of FIG. 4, the PWM generator 10 generates a single drive signal for each of the transistors 16 and 18 of the output switching stage 14. In such an arrangement, the PWM generator 10 no longer has control to ensure that the transistors 16 and 18 of the output switching stage 14 are not simultaneously "on".

Figure 5:
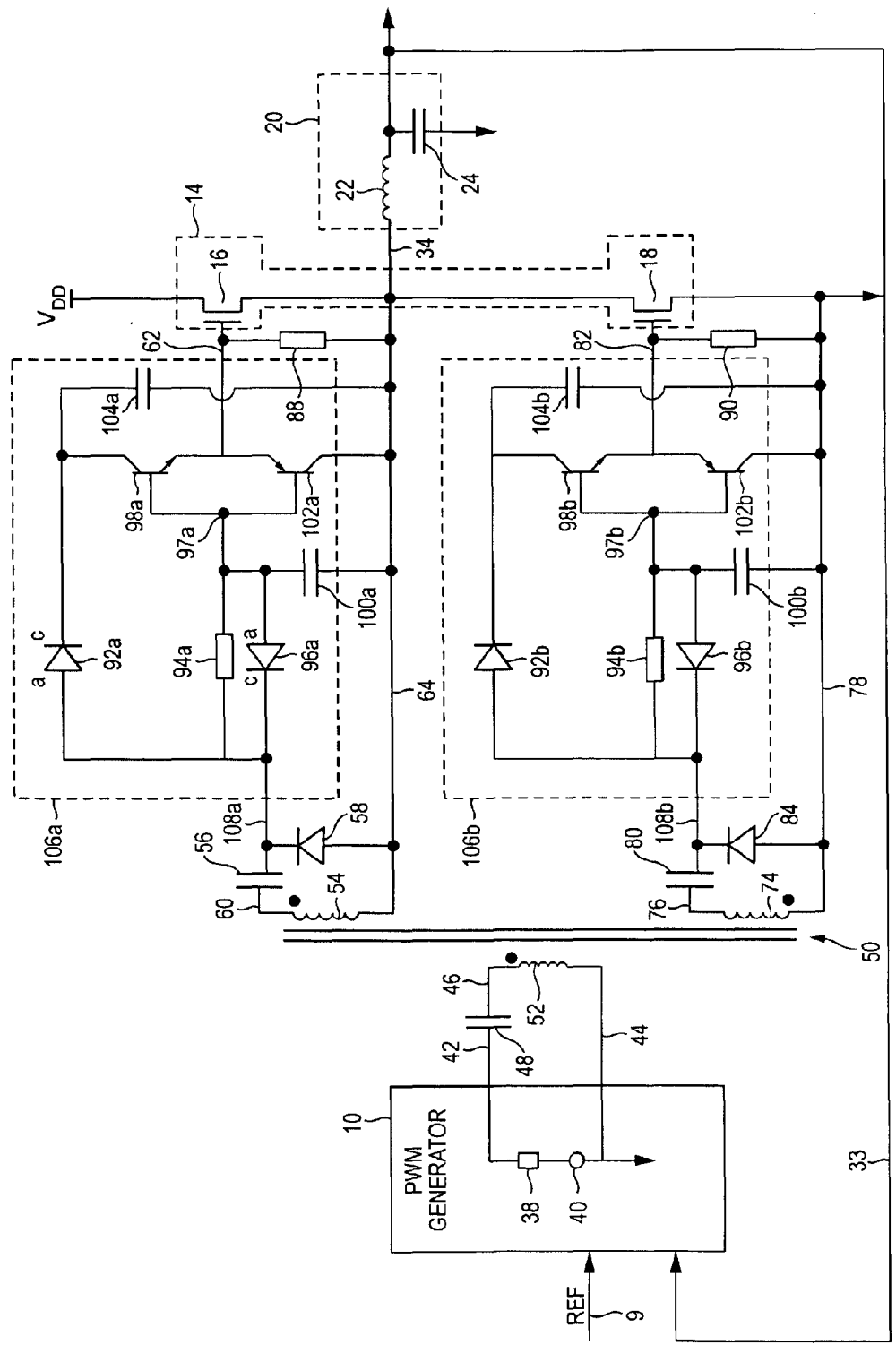
FIG. 5 illustrates a switch mode power supply in accordance with a fourth embodiment of the invention.

With reference to FIG. 5, there is illustrated a fourth embodiment in accordance with the invention which addresses the above-stated problem. In the fourth embodiment, anti-shoot-through measures are introduced.

With reference to FIG. 5, there is illustrated the close loop output stage of FIG. 4 with further modification to provide anti-shoot-through measures. The modification to provide the anti-shoot-through measures in accordance with this described embodiment are provided at the gate inputs to both of the transistors 16 and 18 of the output stage 14. The implementation of an anti-shoot-through driver for the respective gate inputs is identical. As illustrated in FIG. 5, a first anti-shoot-through circuit 106a is provided between the first winding 54 of the second side of the transformer 50 and the gate of the transistor 16, and a second anti-shoot-through circuit 106b is provided between the second winding 74 of the second side of the transformer 50 and the gate of the transistor 18.

The anti-shoot-through driver 106a receives an input on a line 108a and generates an output on the line 62. The line 108a is connected to the second terminal of the capacitor 56, the first terminal of which is connected to the line 60. The diode 58 is connected between the lines 64 and 108a. The resistor 88 is connected between the lines 62 and 64. The optional diode 58 and optional resistor 88 function to provide the same effects as discussed hereinabove with reference to FIG. 2.

The anti-shoot-through driver 106b receives an input on a line 108b, and generates an output on the line 82. The line 108b is connected to the second terminal of the capacitor 80. The diode 84 is connected between the line 108b and the line 78. The resistor 90 is connected between the lines 82 and 78.

The optional diode 84 and the optional resistor 90 provide the same functionality as the corresponding elements shown in FIG. 4.

Each of the anti-shoot-through drivers 106a and 106b is identical, and thus in the following description the anti-shoot-through driver 106a is described. It will be understood that the structure and operation of the anti-shoot-through driver 106b is identical. The elements of the anti-shoot-through drivers 106a and 106b are provided with identical reference numerals, with the suffixes a and b to distinguish between the elements of the two distinct drivers.

The anti-shoot-through driver 106a includes diodes 92a and 96a, a resistor 94a, capacitors 100a and 104a, and bipolar transistors 98a and 102a. The anode of the diode 92a is connected to the input line 108a, a first terminal of the resistor 94a is connected to the input line 108a, and the cathode of the diode 96a is connected to the line 108a. A second terminal of the resistor 94a and the anode of the diode 96a are connected to a common node 97a which is connected to the control nodes, or base terminals, of the bipolar transistors 98a and 102a. The cathode of the diode 92a is connected to the collector terminal of the bipolar transistor 98a. The emitter of the bipolar transistor 98a is connected to the emitter of the bipolar transistor 102a. The common connection of the emitter of the bipolar transistors 98a and 102a is connected to the signal line 62. The collector of the transistor 102a is connected to the line 64 which joins to the output line 34. The capacitor 104a has a first terminal connected to the cathode of the diode 92a, and a second terminal connected to the line 64. The capacitor 100a has a first terminal connected to the common node 97a and a second terminal connected to the line 64.

The transistors 98a and 102a form a gate driver for the high-side FET 16. The components 94a, 96a, 100a form an asymmetric delay circuit for the gate driver formed of transistors 98a and 102a, as is discussed further hereinbelow.

In general, the anti-shoot-through circuits 106a and 106b operate to delay the rising edge of the signal on lines 62 and 82 at the gates of the FETs 16 and 18. The anti-shoot-through circuits 106a and 106b do not delay the falling edge of the signals on lines 62 and 82 at the gate of the FETs 16 and 18 so much. This prevents the FETs 16 and 18 being switched "on" at the same time. The resistor 94a and capacitor 100a form an asymmetric delay network to the base of the bipolar transistors 98a and 102a. The asymmetrical nature of the RC delay network results in the resistance being presented for the input signal being higher for a rising edge in comparison with the falling edge. This results in the delay of the rising edge signal being slower than the delay of the falling edge signal. This behaviour is necessary in order to avoid shoot-through in the arrangement of FIG. 4.

The supply voltage for bipolar driver stage 98a, 102a is derived from the square wave at the secondary of the transformer 50 by half-wave rectifier formed by diode 92a and capacitor 104a.

A further advantage is achieved by the implementation of the anti-shoot-through circuit 106a of FIG. 5. The bipolar transistors 98a and 102a form the final driver for the output switching stage 14. The PWM generator 10 therefore forms a pre-driver, and the bipolar stage of transistors 98a and 102a provide the final driver. Thus the final driver is very close to the output switching stage 14 comprising the output FETs. The inductance between the final driver and the FET gates can therefore be minimised, which is essential for optimising fast switching and good waveform integrity. By contrast, in the arrangement of FIG. 4, the PWM generator 10 itself forms the final driver.

The bipolar transistors 98a and 102a may be replaced with FET devices instead. However the implementation of the bipolar devices 98a and 102a as FET devices introduce a further point at which a shoot-through problem can occur, and therefore additional circuitry would be required to avoid shoot-through of such FET transistors.

The anti-shoot-through circuits 106a and 106b of FIG. 5 are introduced specifically to address the potential for a shoot-through problem as a result of driving each half of the half-bridge output switching circuit 14 from a single PWM generator source. The need for such anti-shoot-through circuitry can be avoided by providing two distinct transformer stages. Thus, with reference to FIG. 2, the transformer 50 in the upper half of the figure may be duplicated by a further transformer in the lower half of the figure, to provide independent transformer drivers for each of the gates of the FETs of the output stage 14, the windings of the first side of each of the transformers being connected to independent voltage sources in the PWM generator 10. In such an arrangement the PWM generator 10 can then control the timing of the signal applied to the first side of each of the respective transformers, to avoid any possibility of shoot-through. In such an arrangement, the transformer in the lower path allows a full voltage scaling and voltage inversion. The PWM controller avoids shoot-through by control of the generator signals.

The arrangement of FIG. 5 shows a preferred implementation for avoiding the shoot-through problem. However other solutions may be provided, and whilst this solution is advantageous the invention and its embodiments are not so limited.

The arrangements shown in various embodiments herein show enhancement mode devices in the output stage 14. The invention is not limited to the implementation of enhancement mode devices, and may also be implemented with depletion mode devices by reversing the polarity of all diodes except—in FIG. 5—diodes 96a and 96b, and changing transistors 98a/98b and 102a/102b—in FIG. 5—to PNP and NPN devices respectively.

As noted above, a closed loop switch mode power supply in accordance with the invention allows for fast switching of the output stage, such that the large output inductor and capacitor can be reduced in size. The closed loop bandwidth of the output stage is increased. The increase in the closed loop bandwidth provides particularly advantageous improvements in modulated power supply applications, such as envelope tracking modulated power supplies. The increase in the closed loop bandwidth additionally provides improvements in load regulation: the closed loop output stage can recover from a sudden change in a load current more quickly, such that the voltage can be restored to its target value more quickly.

The invention, and its embodiments, provides a high closed loop bandwidth for the switch mode power supply. Preferably the closed loop bandwidth is greater than 50 KHz.

The invention, and its embodiments, provides a driver stage for a switch mode power supply with a low delay. Preferably the delay is less than 100 ns.

Figure 6:
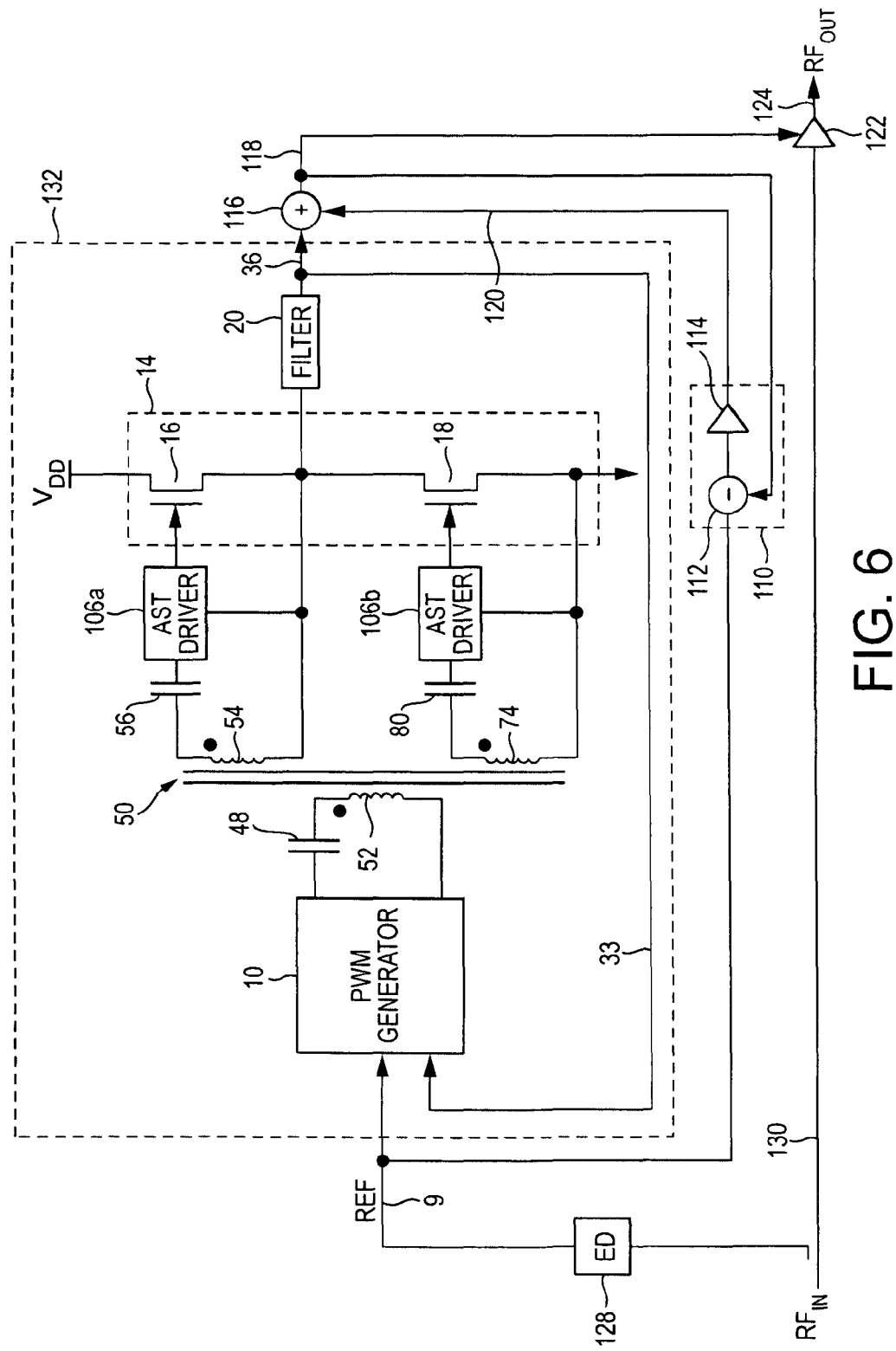
FIG. 6 illustrates an exemplary power supply architecture incorporating the switch mode power supply of the invention.

With reference to FIG. 6, there is illustrated an example implementation in which the switch mode power supply of the various embodiments described hereinabove may be utilised. FIG. 6 illustrates an envelope tracking power supply for an RF power amplifier. Reference numeral 132 generally denotes the switch mode power supply as described hereinabove. The envelope tracking power supply in addition comprises a combiner 116, and an error correction stage 110, comprising a subtractor 112 and an error amplifier 114. An RF input signal to be amplified, $RF_{IN}$, is delivered on a line 130 to an input of an RF amplifier 122. The RF input signal on line 130 is additionally provided to the input of an envelope detector 128, which generates the reference signal REF on line representing the envelope of the RF input signal to be amplified. As described above, the reference signal REF on line 9 provides an input to the PWM generator 10. In addition the reference signal REF on line 9 is provided as an input to the error correction stage 110. The reference signal REF on line 9 provides a first input to a subtractor 112. The output of the subtractor 112 provides an input to an error amplifier 114, which provides an amplified error signal on a line 120. The combiner 116 receives as a first input the output of the switch mode power supply on line 36, and receives as a second input the output of the error correction stage 110 on line 120. The output of the combiner 116 is provided on line 118. The output on line 118 is provided to the error correction stage 110, as a second input to the subtractor 112.

The signal of the output of the combiner 116 on line 118 is a modulated supply voltage for the RF amplifier 122, and is delivered to the supply terminal of the RF amplifier 122. The correction amplifier 110 compares the reference signal REF on line 9 with the output signal generated on 118, and generates an error signal representing the difference therebetween. This error signal is applied, using combiner 116, to the output of the switch mode power supply stage 132, in order to correct the errors contained therein.

The architecture of an envelope tracked power supply for a power amplifier as illustrated with reference to FIG. 6 provides a high efficiency stage, in which the low frequency switch mode power supply is corrected by a high frequency amplification stage.

Figure 7:
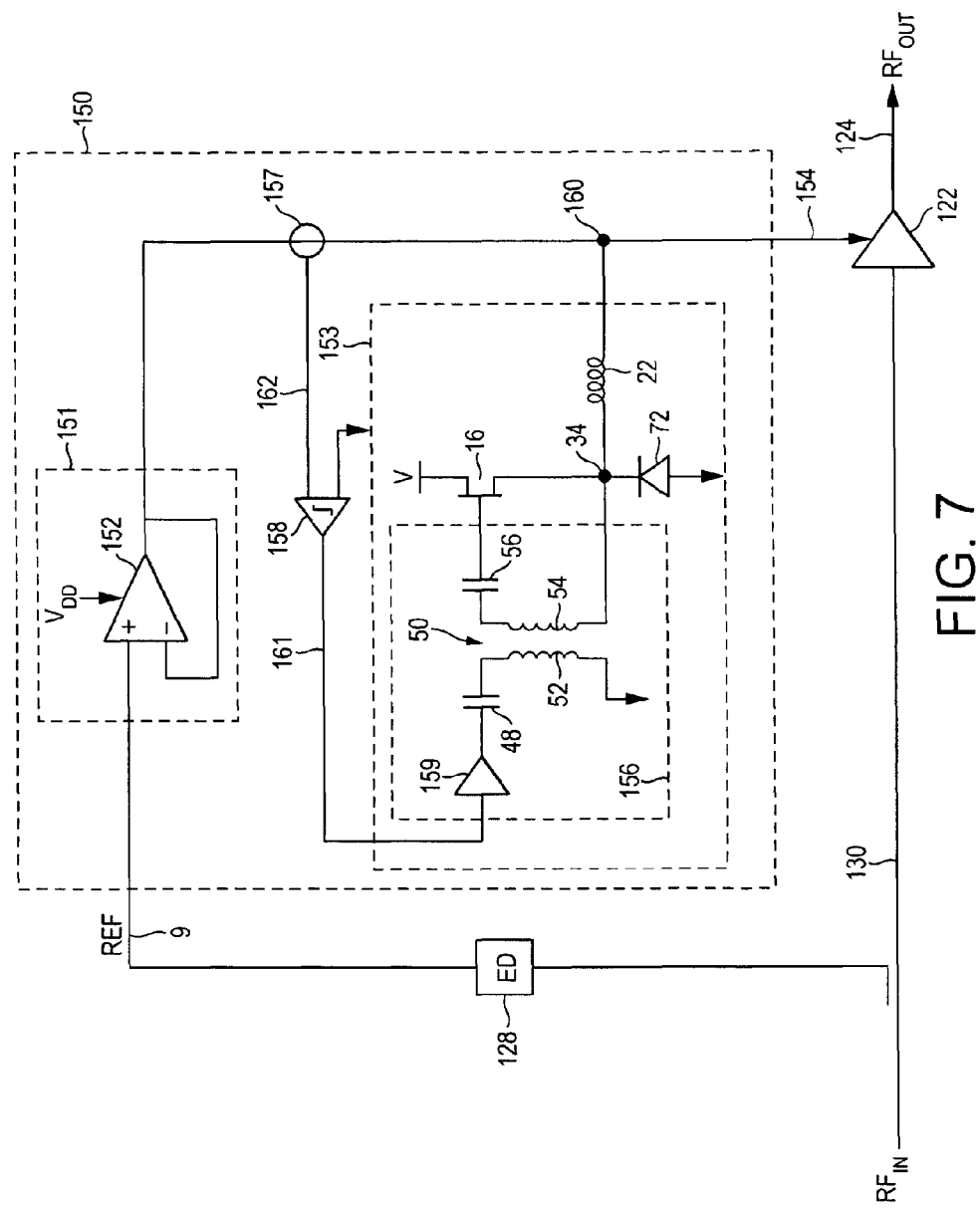
FIG. 7 illustrates an alternative exemplary power supply architecture incorporating the switch mode power supply of the invention.

With reference to FIG. 7, there is illustrated an alternative example implementation in which the switch mode power supply of the various embodiments described hereinabove may be utilised. FIG. 7 again illustrates an envelope tracking power supply for an RF power amplifier. In FIG. 7 there is illustrated the RF power amplifier 122 of FIG. 6, with an RF input signal $RF_{IN}$ on line 130 and an amplified RF output signal $RF_{OUT}$ on line 124. The envelope detector 128 generates the reference signal REF on line 9 from the RF input signal $RF_{IN}$ on line 130. In the arrangement of FIG. 7, modulated power supply stage 150 incorporates a switch mode power supply in accordance with the invention and its embodiments. The modulated power supply stage 150 receives the reference input signal on line 9, and generates a modulated supply voltage for the RF amplifier on line 154.

The modulated power supply stage 150 includes a linear stage 151 and a switch mode power supply stage 153 (the 'switcher stage').

The linear stage 151 comprises a linear amplifier 152 arranged to receive the reference signal on line 9 at a first input thereof, and generate a wideband voltage signal at an output thereof on line 154. The output of the linear amplifier 152 is on the line 154. The linear stage 151 uses local feedback to achieve wide bandwidth and low output impedance. Thus the output voltage of the amplifier 152 is ideally a scaled replica of the input envelope voltage.

The switcher stage 153 provides a current via inductor 22 which is summed with the current from the linear stage 151 at node 160. The current in the output of the linear stage is sensed by a current sensor 157. A signal representative of the sensed current is compared with zero by comparator 158 to produce a PWM signal on line 161 which is used as the input to the switcher 153. It can be seen with reference to FIG. 7 that the implementation of a switcher stage 153 closely resembles the implementation of the switch mode power supply in accordance with an embodiment of the invention as discussed hereinabove with reference to FIG. 3. The switcher stage 153 includes an output stage comprising the transistor 16 and the diode 72, having a commonly connected output node on an output line 34 as described with reference to FIG. 3. A drive input to the transistor 16 is provided by a driver 156, which is implemented in accordance with the principles of the driver as illustrated in FIG. 3. The input to the switcher on line 161 feeds driver 159 which is equivalent to the voltage source 40 and resistor 38 of FIG. 3. The output of driver 159 is connected to one terminal of capacitor 48, which has its other terminal connected to a first terminal of the winding 52 of the transformer 50. The other terminal of the winding 52 is connected to ground. The winding 54 of the second side of the transformer 50 is connected at one terminal to the output line 34, and at the other terminal to the capacitor 56, the other terminal of the capacitor 56 being connected to the gate of the FET 16. The optional diode 58 and optional resistor 88 of the switch mode power supply in accordance with the invention, as shown in FIG. 3, are not illustrated in FIG. 7 for reasons as simplifying the drawing. Similarly the anti-shoot-through circuitry described in relation to alternative embodiments hereinabove is not illustrated in FIG. 7 for simplification. However these various optional improvements may be incorporated in the architecture of FIG. 7.

As further shown in FIG. 7, the output line 34 is connected to one terminal of an inductor 22, the other terminal of which is connected to the output line 154 on which the supply voltage for the power amplifier is developed.

Thus FIGS. 6 and 7 illustrate two alternative architectures for implementing a switch mode power supply in accordance with the invention and its embodiments in an envelope tracking power supply stage for a power amplifier. One skilled in the art will appreciate that the invention may more generally be applicable to other envelope tracking power supply architectures.

The invention has been described by way of reference to various illustrative embodiments. Features of different embodiments may be combined. The invention is not limited to the details of any embodiment presented herein. The scope of the invention is defined by the appended claims.

What is claimed is:

1. An envelope tracked power supply comprising a high bandwidth, low delay closed loop switch mode power supply stage, comprising:
   a single pulse width modulator for generating a width modulated pulse in dependence on an input signal and an output voltage of the switch mode power supply stage;
   a single wideband transformer, having a winding of a first side connected to receive the modulated pulse, and first and second windings of a second side;
   a first transistor having a conductive path connected between a first supply voltage and an output of the switch mode power supply stage;
   a second transistor having a conductive path connected between a second supply voltage and the output of the switch mode power supply stage; and
   an anti-shoot-through circuit comprising:
      a first circuit comprising:
         a third transistor connected to receive a modulated pulse induced in the first winding of the second side of the transformer at a control node of the third transistor; and
         a fourth transistor connected to receive the modulated pulse induced in the first winding of the second side of the transformer at a control node of the fourth transistor, wherein an emitter of the third transistor and an emitter of the fourth transistor are connected with a control node of the first transistor; and
      a second circuit comprising:
         a fifth transistor connected to receive a modulated pulse induced in the second winding of the second side of the transformer at a control node of the fifth transistor; and
         a sixth transistor connected to receive the modulated pulse induced in the second winding of the second side of the transformer at a control node of the sixth transistor, wherein an emitter of the fifth transistor and an emitter of the sixth transistor are connected with a control node of the second transistor.

2. The envelope tracked power supply of claim 1 further comprising a diode connected in parallel with the first winding of the second side of the transformer.

3. The envelope tracked power supply of claim 1 further comprising a resistor connected between the control node of the first transistor and the output.

4. The envelope tracked power supply of claim 1 further comprising a diode connected in parallel with the second winding of the second side of the transformer.

5. The envelope tracked power supply of claim 1 further comprising a resistor connected between the control node of the second transistor and the second supply voltage.

6. The envelope tracked power supply of claim 1, wherein:
   the first circuit of the anti-shoot-through circuit further includes a first resistor connected to receive the modulated pulse induced in the first winding of the second side of the transformer and provide the modulated pulse induced in the first winding of the second side of the transformer to the control node of the third transistor and the control node of the fourth transistor; and
   the second circuit of the anti-shoot-through circuit further includes a second resistor connected to receive the modulated pulse induced in the second winding of the second side of the transformer and provide the modulated pulse induced in the second winding of the second side of the transformer to the control node of the fifth transistor and the control node of the sixth transistor.

7. The envelope tracked power supply of claim 1 wherein the closed loop bandwidth of the switch mode power supply stage is greater than 50 KHz.

8. The envelope tracked power supply of claim 1 wherein the delay of the transformer is less than 100 ns.

9. The envelope tracked power supply of claim 1, wherein the input signal represents the envelope of a signal to be amplified.

10. The envelope tracked power supply according to claim 9 further comprising an error correction stage for correcting an error in the output voltage in dependence on a comparison between the output voltage and the input signal.

11. An RF power amplification stage comprising an envelope tracked power supply according to claim 1 and a power amplifier.

* * * * *